(12) United States Patent
Boeck et al.

(10) Patent No.: US 8,115,274 B2
(45) Date of Patent: Feb. 14, 2012

(54) FUSE STRUCTURE AND METHOD FOR MANUFACTURING SAME

(75) Inventors: Josef Boeck, Munich (DE); Herbert Knapp, Munich (DE); Wolfgang Liebl, Bad Abbach (DE); Herbert Schaefer, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 502 days.

(21) Appl. No.: 11/855,004

(22) Filed: Sep. 13, 2007

(65) Prior Publication Data

US 2008/0067627 A1 Mar. 20, 2008

(30) Foreign Application Priority Data

Sep. 15, 2006 (DE) .......................... 10 2006 043 484

(51) Int. Cl.
*H01L 29/00* (2006.01)
(52) U.S. Cl. . 257/529; 257/499; 257/528; 257/E23.149; 257/E21.529
(58) Field of Classification Search .................. 257/529, 257/665; 361/39, 41, 104, 124
See application file for complete search history.

(56) References Cited

U.S. PATENT DOCUMENTS

| | | | | |
|---|---|---|---|---|
| 5,760,453 A * | 6/1998 | Chen | .............................. | 257/529 |
| 6,008,075 A * | 12/1999 | Lien et al. | ...................... | 438/132 |
| 6,111,301 A * | 8/2000 | Stamper | ........................ | 257/529 |
| 6,150,706 A * | 11/2000 | Thakur et al. | ................. | 257/532 |
| 6,162,686 A * | 12/2000 | Huang et al. | ................... | 438/281 |
| 6,163,062 A * | 12/2000 | Shiratake et al. | ............. | 257/529 |
| 6,218,279 B1 * | 4/2001 | Weber et al. | ................... | 438/601 |
| 6,329,234 B1 * | 12/2001 | Ma et al. | ........................ | 438/210 |
| 6,375,159 B2 * | 4/2002 | Daubenspeck et al. | ........ | 257/529 |
| 6,392,284 B1 * | 5/2002 | Thakur et al. | .................. | 257/530 |
| 6,444,544 B1 * | 9/2002 | Hu et al. | ........................ | 438/467 |
| 6,451,681 B1 | 9/2002 | Greer | | |
| 6,496,053 B1 * | 12/2002 | Daubenspeck et al. | ........ | 327/525 |
| 6,677,195 B2 * | 1/2004 | Tsuura | ........................... | 438/215 |
| 6,693,343 B2 * | 2/2004 | Barth | ............................. | 257/529 |
| 6,713,838 B2 * | 3/2004 | Pricer et al. | ..................... | 257/529 |
| 6,746,947 B2 * | 6/2004 | Daubenspeck et al. | ........ | 438/601 |
| 6,784,049 B2 * | 8/2004 | Vaartstra | ........................ | 438/240 |
| 6,822,310 B2 * | 11/2004 | Kono et al. | .................... | 257/529 |
| 6,873,027 B2 * | 3/2005 | Dalton et al. | .................. | 257/529 |
| 7,064,409 B2 * | 6/2006 | Badami et al. | ................. | 257/529 |
| 7,180,154 B2 * | 2/2007 | Cho et al. | ....................... | 257/529 |
| 7,378,718 B2 * | 5/2008 | Tsutsui | .......................... | 257/529 |
| 7,384,824 B2 * | 6/2008 | Badami et al. | ................. | 438/132 |
| 7,393,722 B1 * | 7/2008 | Issaq et al. | ..................... | 438/131 |
| 7,535,078 B2 * | 5/2009 | Kobayashi et al. | ............ | 257/529 |
| 7,576,380 B2 * | 8/2009 | Thakur et al. | .................. | 257/300 |
| 2003/0116820 A1 * | 6/2003 | Daubenspeck et al. | ........ | 257/529 |
| 2004/0017279 A1 * | 1/2004 | Kamoshima et al. | ......... | 336/200 |
| 2006/0057783 A1 * | 3/2006 | Yun et al. | ....................... | 438/128 |
| 2006/0118963 A1 | 6/2006 | Yamada | | |
| 2006/0145291 A1 * | 7/2006 | Badami et al. | ................. | 257/529 |
| 2007/0267651 A9 * | 11/2007 | Kobayashi et al. | ............ | 257/100 |

\* cited by examiner

*Primary Examiner* — Davienne Monbleau
*Assistant Examiner* — William Harriston
(74) *Attorney, Agent, or Firm* — Slater & Matsil, L.L.P.

(57) ABSTRACT

A fuse structure includes a substrate, a fuse conductive trace disposed closer to a first chip surface than to a second chip surface facing away from the first chip surface, a metallization layer on the substrate disposed on a side of the fuse conductive trace facing away from the first chip surface, and a planar barrier multilayer assembly disposed between the fuse conductive trace and the metallization layer and including multiple barrier layers of different materials, wherein the fuse conductive trace, the metallization layer and the barrier multilayer assembly are arranged such that when cutting the fuse conductive trace and the barrier multilayer assembly, a first area of the metallization layer is electrically isolated from a second area of the metallization layer.

20 Claims, 8 Drawing Sheets

FUSE STRUCTURE AND METHOD FOR MANUFACTURING SAME

This application claims priority from German Patent Application No. 10 2006 043 484.6, which was filed on Sep. 15, 2006, and is incorporated herein by reference in its entirety.

TECHNICAL FIELD

An embodiment of the present invention relates to a fuse structure (i.e., fusible link structure), and to a method for manufacturing the same.

BACKGROUND

In the present application, fuse (fuse=fusible link) means a structure and/or conductive trace in an integrated circuit and/or a semiconductor device that can be destroyed after manufacturing the semiconductor device and/or processing the same at the wafer level. Thus, for example an electrically conductive connection and/or a fuse conductive trace can be cut, thereby effecting a later change in circuit behavior. Destroying and/or cutting is performed by means of an electrical current surge or a laser spike.

The fuse structures are used, for example, for cutting defective parts of a circuit after completion and/or manufacturing of a semiconductor device, or for trimming properties of finished circuits to a target value later on and/or after the processing of a wafer on which the circuit is deposited. Additionally, fuse structures are used to enable an identification of the individual chips, wherein a special code which can be read out electrically and/or optically is created by separating the fuse and/or cutting the fuse conductive trace.

Since a sealed surface that protects an underlying circuit structure is broken open when destroying the fuse structure, a corrosion problem often arises after destroying the fuse conductive trace. The corrosion occurring due to the prevailing humidity in the surroundings or due to contacting the semiconductor device with an aggressive substance, for example, to process a surface of the semiconductor device in a further method step, can thereby propagate and/or continue along conductive traces and may even result in a breakdown of the circuit.

In order to limit and/or to prevent propagation of the corrosion, a terminal of a fuse conductive trace and/or a contacting of the fuse conductive trace is implemented by buried polysilicon lines that are not in danger of corrosion. Corrosion propagating into the substrate of the semiconductor device then comes to a halt at the polysilicon lines without further parts of the circuit in the semiconductor device being damaged. But since the deeply buried polysilicon lines are used for contacting the fuse conductive trace, it is necessary with a semiconductor device with a conventional fuse structure to create an electric connection via conductors and vias which typically extend in the semiconductor device in a vertical direction. This results in an increase in a resistance of the fuse structure in an order of a few tens of Ohms. At the same time, additional parasitic capacitances arise due to a small distance between the polysilicon lines in the polysilicon level and a substrate on which the circuit structures in the semiconductor device are arranged. The resulting increase in the parasitic capacitances as well as the increase in the resistance are undesired and/or not tolerable when using the fuse structure in semiconductor devices with ultra-high-frequency circuits, such as, for example, a 77 GHz oscillator, because they limit performance and/or capability of the circuit.

Therefore, conventional fuse structures are not suitable for being used in ultra-high-frequency circuits and/or RF circuits, which is why up to now late trimming and/or adjusting of the features of the circuit of high-frequency circuits and/or ultra-high-frequency circuits by means of cutting the fuse conductive trace is not possible.

SUMMARY OF THE INVENTION

According to an embodiment, a fuse structure may have a substrate, a fuse conductive trace disposed closer to a first chip surface than to a second chip surface facing away from the first chip surface, a metallization layer on the substrate disposed on a side of the fuse conductive trace facing away from the first chip surface, and a planar barrier multilayer assembly disposed between the fuse conductive trace and the metallization layer and having multiple barrier layers of different materials. The fuse conductive trace, the metallization layer and the barrier multilayer assembly are disposed such that a first area of the metallization layer is electrically isolated from a second area of the metallization layer when cutting the fuse conductive trace and the barrier multilayer assembly.

According to another embodiment, a method for manufacturing an electrical device with a fuse structure according to an embodiment of the present invention may have a step of providing a substrate, a step of depositing a first planar area and a second planar area of a metallization layer on the substrate so that the first planar area and the second planar area are separated from each other, a step of forming a planar barrier multilayer assembly having multiple barrier layers of different materials on the planar areas of the metallization layer, and a step of depositing a fuse conductive trace on the barrier multilayer assembly such that cutting the fuse conductive trace and the barrier multilayer assembly would result in electrically isolating the first area of the metallization layer from the second area of the metallization layer.

BRIEF DESCRIPTION OF THE DRAWINGS

In what follows, embodiments of the present invention will be explained in greater detail referring to the accompanying drawings, in which.

DETAILED DESCRIPTION OF ILLUSTRATIVE EMBODIMENTS

Figure 1:
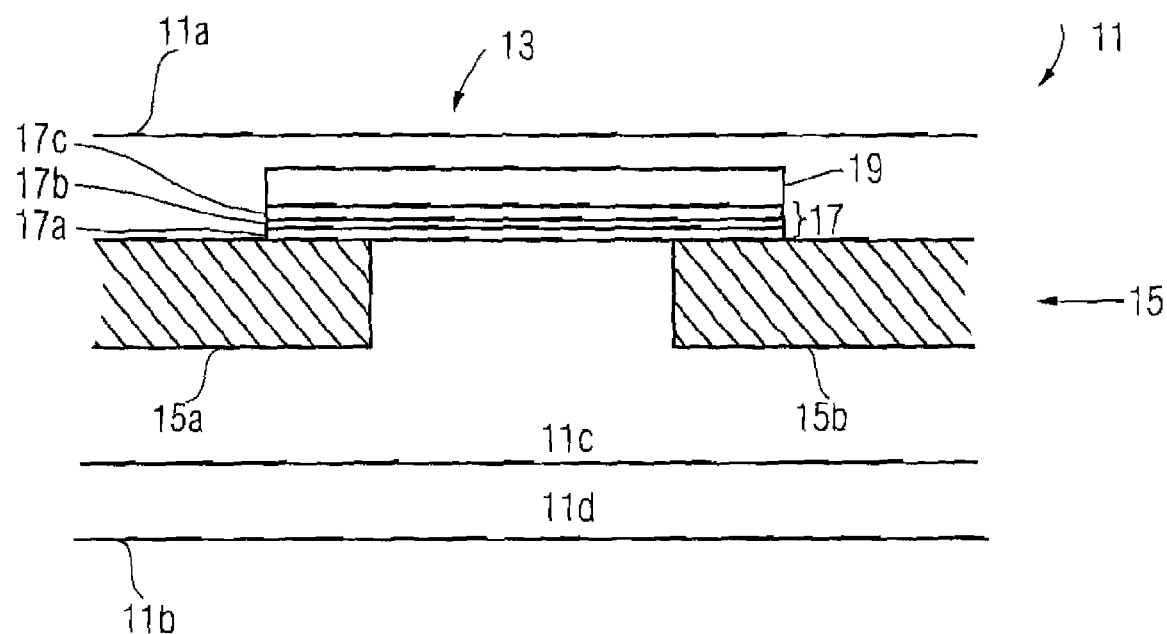
FIG. 1 is a schematic cross-sectional view of a fuse structure according to a first embodiment of the present invention.

FIG. 1 shows a schematic cross-sectional view of a chip 11 with a first chip surface 11a and a second chip surface 11b. The chip comprises a fuse structure 13 according to a first embodiment of the present invention. The fuse structure 13 comprises a planar metallization layer 15 with a first sub-area 15a and a second sub-area 15b. The first sub-area 15a and the second sub-area 15b are separated from each other by a recess in the metallization layer 15. A planar barrier multilayer assembly 17 is disposed on the first sub-area 15a and the second sub-area 15b and comprises at least two, and in the shown example three, layers, namely a first barrier layer 17a, a second barrier layer 17b and a third barrier layer 17c being disposed in the above-mentioned sequence in a direction from the second chip surface 11b to the first chip surface 11a. A fuse conductive trace 19 is disposed on the third barrier layer 17c.

A wiring metallization area 11c and a substrate area 11d, which is composed, for example, of silicon, of the chip may follow underneath the metallization layer 15. The sub-areas 15a, 15b can comprise, for example, a copper or a tungsten material. The wiring metallization area 11c can include multiple metal levels, for example, a multilayer assembly, not shown here, of multiple metal layers being disposed on top of one another with conductive traces of metal and isolating areas between the conductive traces. The first barrier layer 17a is formed of tantalum nitride, for example, whereas the second barrier layer 17b is formed of tantalum, for example, and the third barrier layer 17c is formed of titanium nitride. The fuse conductive trace 19 can be composed of aluminum or an aluminum alloy, for example.

The metallization layer 15 serves for contacting the fuse conductive trace 19, wherein the first sub-area 15a and the second sub-area 15b of the metallization layer 15 are each electrically conductively connected via the barrier multilayer assembly 17 and the fuse conductive trace 19. The barrier multilayer assembly 17 here is composed of electrically conductive materials so that, as mentioned before, the fuse conductive trace 19 and the sub-areas 15a, 15b are electrically connected with each other in the fuse structure 13. The fuse conductive trace 19 can be fused by bombardment with laser energy or by thermal energy as the result of a high current flow through the fuse conductive trace 19 so that an electric connection between the first sub-area 15a and the second sub-area 15b via the fuse conductive trace 19 and the planar barrier multilayer assembly 17 is prevented, so that the first sub-area 15a and the second sub-area 15b are separated from each other after cutting the fuse conductive trace 19 and the barrier multilayer assembly 17.

In the fuse structure 13 according to a first embodiment of the present invention, the planar barrier multilayer assembly 17 serves to bring a corrosion process spreading over the fuse conductive trace 19 to a halt, when a hole is created above the fuse conductive trace 19 in the chip 11, for example, in a passivation layer of the same in the vicinity of the first chip surface 11a, as a result of cutting the fuse conductive trace 19. Therefore, the barrier layers 17a, 17b, 17c are manufactured, for example, from a corrosion-resistant material.

A plurality of the barrier layers 17a-17c are disposed on the fuse structure 13 according to a first embodiment of the present invention between the fuse conductive trace 19 and the metallization layer 15 so that, even in case the corrosion-resistant barrier layers 17a-17c are destroyed by a penetrating aggressive substance, the barrier layer adjacent thereto does not, with a high probability, corrode, and thus an aggressive substance cannot propagate further from the fuse structure 13 to the chip 11.

It is of particular advantage with the design of the barrier multilayer assembly as a planar structure that it can easily be formed when manufacturing the chip 11 with the fuse structure 13.

As opposed to the conventional fuse structures, arranging the barrier multilayer assembly enables contacting the fuse conductive trace 19 by a metallization layer 15 disposed close to the fuse conductive trace 19. For contacting the fuse conductive trace 19, the terminals and/or the two sub-areas 15a, 15b of the metallization layer 15 can, in contrast to a conventional fuse structure, be disposed in a metal level lying directly under the fuse conductive trace 19, so that contacting the fuse conductive trace 19 via a polysilicon line in a polysilicon level deep in the chip 11 is not necessary. Instead, the contacting is accomplished directly via the metallization layer 15 disposed under the fuse conductive trace 19 which is disposed only one metal level deeper underneath the fuse.

Thus, a resistance of the contacting of the fuse conductive trace 19 in the fuse structure 13 is reduced due to a small number of transitions between different metal levels. Since the contacting of the fuse conductive trace 19 is not accomplished via a transition between a polysilicon line and a conductive trace in a metal level, but is accomplished only via a small number of transitions between conductive traces in different metal layers, the resistance of the contacting of the fuse conductive trace 19 is additionally reduced. Further, in contrast to a conventional fuse structure with contacting in a deeper metal level, a distance between the metallization layer 15 and the substrate area 11d is increased so that a forming parasitic capacitance between the sub-areas 15a, 15b on the one hand and the substrate area 11d on the other hand is reduced. In other words, the reduced parasitic capacitance of the fuse structure 13 is achieved by the greater distance of the fuse structure 13 to the substrate and/or the substrate area 11d.

Due to the fact that the fuse structure 13 according to the first embodiment of the present invention comprises a lower parasitic capacitance and comprises a lower contacting resistance, i.e., for example, as opposed to a conventional fuse structure reduced by a factor of 10, the fuse structure 13 according to a first embodiment of the present invention comprises a lower RC constant and thus improved high-frequency properties.

Only the improved high-frequency properties of the fuse structure according to a first embodiment of the present invention with lower series resistances and lower parasitic capacitances enable usage of the fuse structure 13 in a high-frequency circuit. A high-frequency circuit implemented in this way comprising the fuse structure 13 according to a first embodiment of the present invention can then be tested at the wafer level after its completion and/or processing and can then be changed afterwards, for example, in its high-frequency properties, so that its electric properties can be trimmed to a target value and/or can meet a predefined specification.

A further advantageous application possibility of the fuse structure 13 according to a first embodiment of the present invention results in standard devices, such as storage devices, in which a dedicated part of a circuit is to be separated at the wafer level based on a result of a test, or in which an identification of the chip 11 is to be enabled by cutting the fuse conductive trace 19. The above-mentioned lower resistance in contrast to a conventional fuse structure in these standard devices results in lower heating and thus reduced and/or improved power consumption.

Figure 2A:
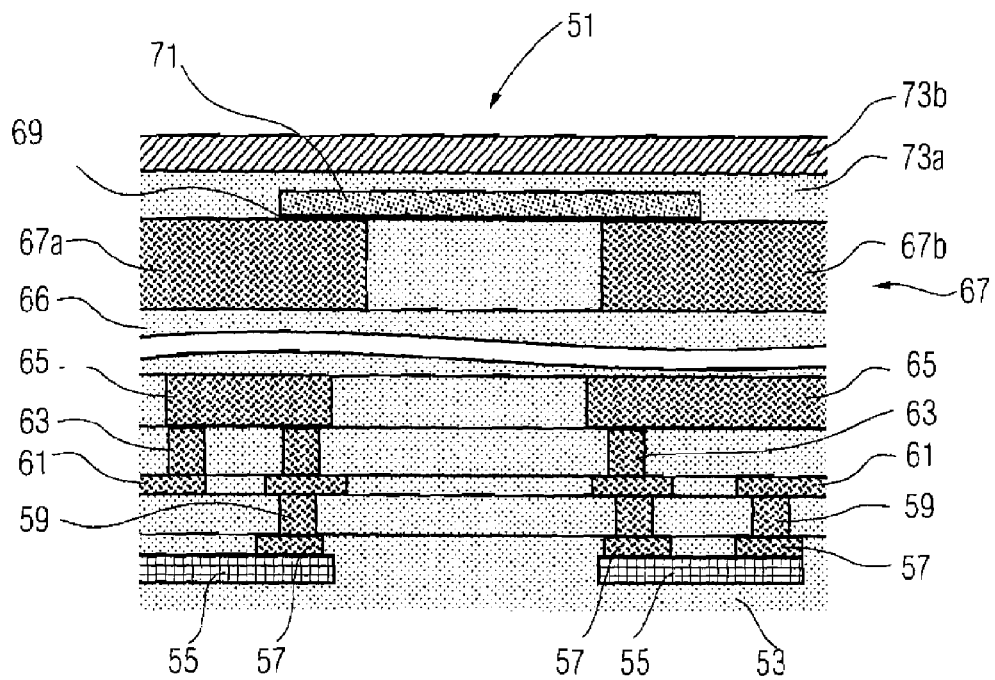
FIGS. 2a-2c are schematic cross-sectional views of a fuse structure according to a second embodiment of the present invention on a semiconductor device while cutting the fuse conductive trace.
Figure 2B:
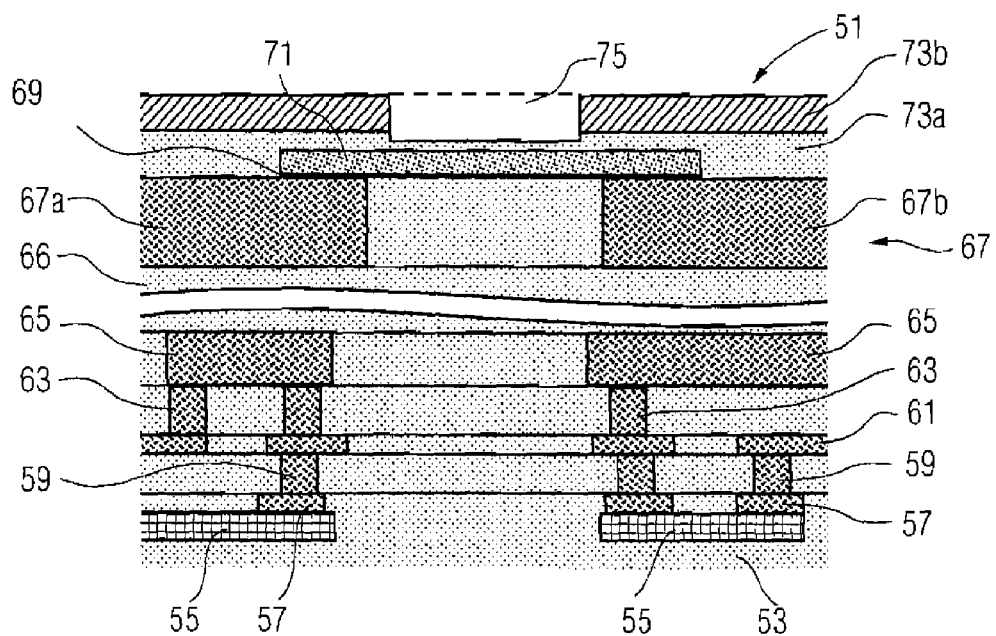
Figure 2C:
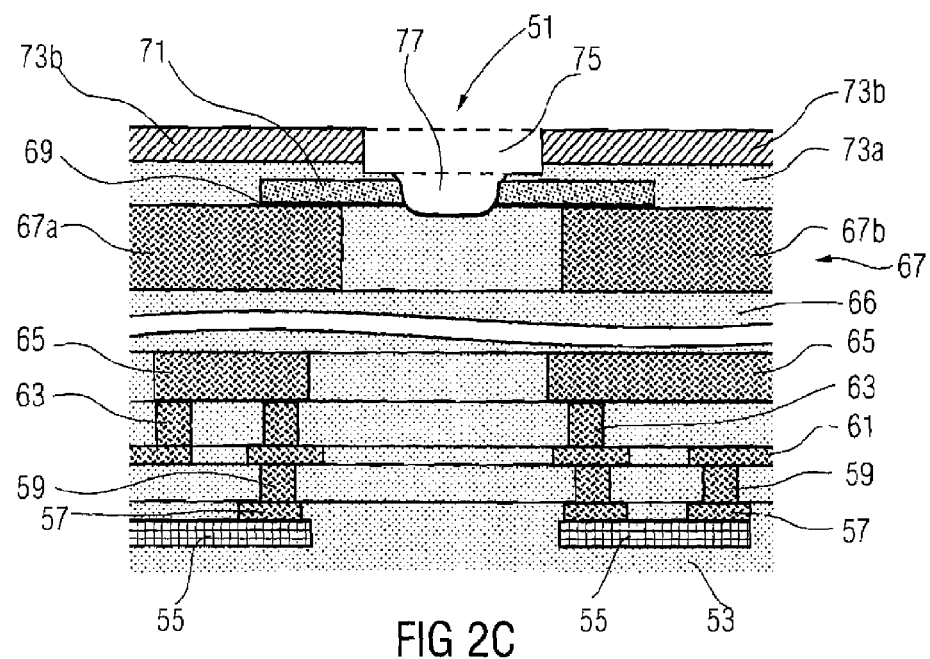

Schematic cross-sectional views of a fuse structure 51 according to a second embodiment of the present invention are shown in FIGS. 2a-2c which explains the processes when cutting a fuse conductive trace. Disposed on or in a substrate 53 are two polysilicon conductive traces 55 on which in turn conductive traces 57 forming a first metal layer are disposed in a way shown in FIG. 2a. Created on the conductive traces 57 of the first metal level are multiple first vias 59 on which conductive traces 61 of a second metal level are formed which, in turn, are connected to conductive traces 65 in a third metal level via second vias 63. In the fuse structure shown in FIG. 2a according to a second embodiment of the present invention, the conductive traces 57, 61, 65 of the metal levels represent only a number of conductive traces in any number of metal levels which can be used in the fuse structure 51 according to a second embodiment of the present invention to connect the polysilicon conductive trace 55 with any circuit structures on a semiconductor device shown here only partly on which the fuse structure 51 according to a second embodiment of the present invention is implemented. Disposed on the conductive traces 65 of the third metal level is an isolating layer 66 on which, in turn, two portions and/or areas 67a, 67b of a metallization layer 67 are disposed. The areas 67a, 67b can be connected to one of the metal levels or other circuit structures of the chip.

The first area 67a of the metallization layer 67 and the second area 67b are separated from each other in the level of the metallization layer 67 by a recess in the metallization layer 67 in which an isolating material is disposed. However, in the structure of the fuse structure 51 according to a second embodiment of the present invention shown in FIG. 2a, the two areas 67a, 67b are electrically connected with each other via a planar barrier multilayer assembly 69 created on the first area 67a and the second area 67b of the metallization layer 67 and a fuse conductive trace 71 disposed on the planar barrier multilayer assembly 69, wherein the planar barrier multilayer assembly includes, similar to the multilayer assembly 17 shown in FIG. 1, a plurality of barrier layers of which only one layer is shown in FIG. 2a for the sake of simplicity. The planar barrier multilayer assembly 69 in turn serves, as in the fuse structure 13 according to a first embodiment of the present invention in FIG. 1, as a corrosion stop. Deposited on both areas 67a, 67b of the metallization layer 67 as well as the fuse conductive trace 71 is an oxide layer 73a on which a nitride layer 73b is disposed. The oxide layer 73a and the nitride layer 73b are dielectric layers which serve as a passivation and protect the semiconductor device and/or the element shown here only partially against environmental influences, such as humidity.

In what follows, manufacturing of the semiconductor device with the fuse structure 51 according to a second embodiment of the present invention which is shown only partly in FIG. 2a will be explained. At first, an integrated circuit with a multilayer metallization, of which the areas 57, 59, 61, 63, 65 in the respective metal levels as well as the isolating layer 66 is shown, is created on the substrate 53. Then, the actual portions of the fuse structure 51 according to a second embodiment of the present invention are formed. Initially, the areas 67a, 67b of the metallization layer 67 are created, wherein the areas 67a, 67b are each implemented as planar structures. Subsequently, an electrically conductive planar barrier and/or planar barrier multilayer assembly 69 which in this case is composed, for example, of a titanium nitride layer of a thickness of 30 nm, a titanium layer of a thickness of 20 nm and a titanium nitride layer of a thickness of 50 nm, is disposed on the areas 67a, 67b and an isolating material between the areas 67a, 67b, or, in other words, inserted between the metallization layer 67 and the overlying layer in which the fuse conductive trace 71 is subsequently formed.

Then, the fuse conductive trace 71 of aluminum or an aluminum alloy is deposited and structured in the last and/or upper metal level. The fuse conductive trace 71 is thereby formed in the last metallization level in which portions and/or further conductive areas which are used for other purposes, for example, for contacting bond pads are also to be formed. Subsequently, the oxide layer 73a, which here comprises a thickness of, for example, 300 nm, and then the nitride layer 73b, which here comprises a thickness of 550 nm, are deposited on the aluminum layer and/or the fuse conductive trace 71.

The method for manufacturing the fuse structure 51 explained above can be performed in a simple manner because the fuse conductive trace 71, the first and the second areas 67a, 67b of the metallization layer 67 are planar structures, and/or even the multiple barrier layers in the barrier multilayer assembly 69 are each planar structures. The barrier layers are, for example, deposited one on top of the other in the barrier multilayer assembly 69 so that they each border one another. Thus, in a top view in a direction from the nitride layer 73b to the substrate 53 and/or in a direction from a first chip surface to a second chip surface facing away from the first chip surface, surfaces of the respective barrier layers facing each other each overlap completely in the planar barrier multilayer assembly 69.

After manufacturing the fuse structure 51 shown in FIG. 2a on the semiconductor device, in a step of the method not shown in FIGS. 2a-2c, the passivation 73a, 73b is opened at the locations where subsequently the bond pads will be deposited to enable later contacting. In a further step of structuring and etching, the passivation 73a, 73b is etched away up to a defined remaining thickness of the oxide layer 73a of approx. 200 nm, thus creating an opening 75 (FIG. 2b) in the passivation 73a, 73b and/or the oxide layer 73a and the nitride layer 73b above the fuse conductive trace 71.

Due to the fact that the opening 75 and/or a fuse window in which a rest of the passivation remains is formed in the passivation 73a, 73b above the fuse conductive trace 71, the laser beam used for cutting the fuse conductive trace 71 can enter via the opening 75 so that an absorption of a laser energy by the fuse conductive trace 71 is increased. Even a lower laser power suffices to cut the fuse conductive trace 71. If the step of forming the opening 75 were to be omitted, subsequent irradiation of the fuse structure 51 with laser light would result in a high degree of the light being absorbed by the nitride layer 73b, which would impede and/or prevent cutting open of the fuse conductive trace 71.

A design of the fuse structure 51 according to a second embodiment of the present invention after cutting the fuse conductive trace 71 is illustrated in FIG. 2c. After the fuse structure 51 shown in FIG. 2b has been irradiated with laser light, a recess 77 is formed in the fuse conductive trace 71 and the planar barrier multilayer assembly 69 as a result of the fuse conductive trace 71 heating. Thus, two portions of the barrier multilayer assembly 69 and the fuse conductive trace 71, which each border one of the two areas 67a, 67b, are separated from each other so that the first area 67a of the metallization layer 67 and the second area 67b of the metallization layer 67 are electrically isolated from each other.

A width and a thickness of the fuse conductive trace are designed so that the fuse conductive trace 71 and/or the fuse can be cut with an appropriate low laser power, because an irradiation of the fuse structure 51 with a higher laser power could bring about a defect and/or damage in the semiconductor device, which is shown here only partially, in the layers lying deeper. At the same time, however, the width and the thickness of the fuse conductive trace 71 should not be too small because this would increase the electric resistance between the areas 67*a*, 67*b* and thus the contactings of the fuse structure 51.

Figure 3:
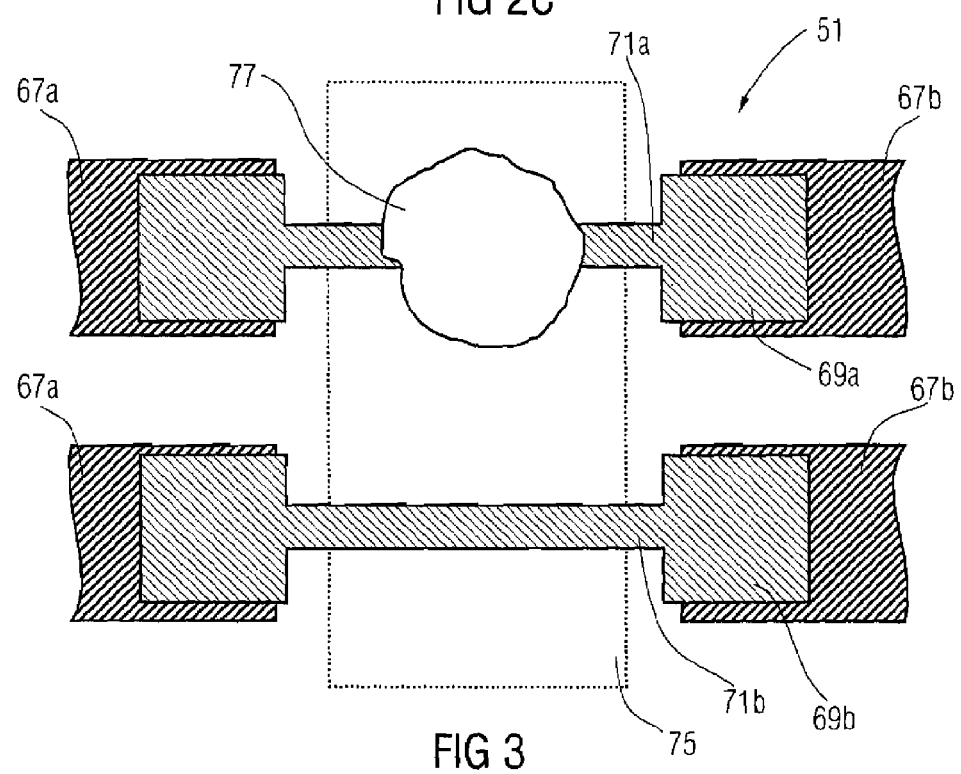
FIG. 3 is a top view of the fuse structure shown in FIG. 2c according to a second embodiment of the present invention.

A top view of the fuse structure 51 according to a second embodiment of the present invention shown in FIG. 2*c* is shown in FIG. 3. In the fuse structure 51 of FIG. 3 a first fuse conductive trace 71*a* has been cut by means of laser energy with the method illustrated in FIGS. 2*a*-2*c*, while a second fuse conductive trace 71*b* has not been irradiated with laser energy so that the areas 67*a*, 67*b* of the metallization layer 67 lying under the ends of the second fuse conductive trace 71*b* are still electrically connected with one another.

Figure 4A:
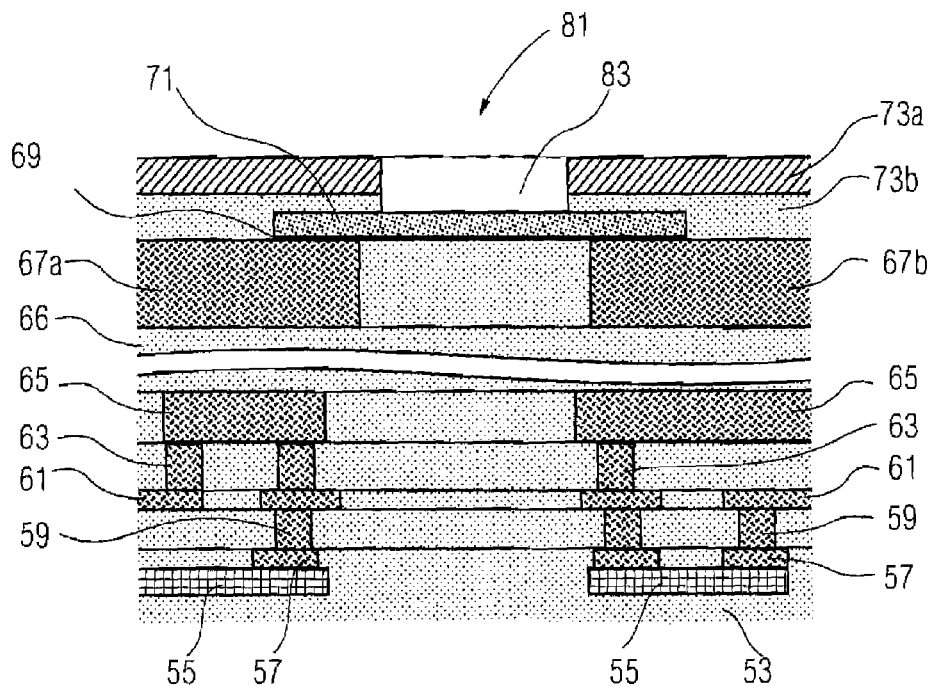
FIGS. 4a-4b are schematic cross-sectional views of a fuse structure according to a third embodiment of the present invention on a semiconductor device while cutting the fuse conductive trace.

FIG. 4*a* shows a schematic cross-sectional view of a fuse structure 81 according to a third embodiment of the present invention. In what follows, similar elements or elements appearing as similar relating to the fuse structure 51 according to a second embodiment of the present invention of FIG. 2*b* are provided with similar reference numerals. Further, a description of the design and the mode of operation of the fuse structure 81 according to a third embodiment of the present invention shown in FIG. 4*a* is restricted to a description of the differences in the design and the mode of operation as compared to the fuse structure 51 shown in FIG. 2*b*.

As opposed to the fuse structure 51 according to a second embodiment of the present invention shown in FIG. 2*b*, in the fuse structure 81 according to a third embodiment of the present invention shown in FIG. 4*a* a recess 83 is formed in the oxide layer 73*a* and the nitride layer 73*b* such that the recess 83 extends to the fuse conductive trace 71. In other words, the remaining oxide over the fuse has been removed and/or etched away completely. It is advantageous in the fuse structure 81 according to a third embodiment of the present invention that the fuse structure 81 can be manufactured in a simple manner because etching processes with high selectivity between the passivation 73*a*, 73*b* and the fuse conductive trace 71 can be used for manufacturing the fuse structure 81, thus enabling greater etching tolerance.

Figure 4B:
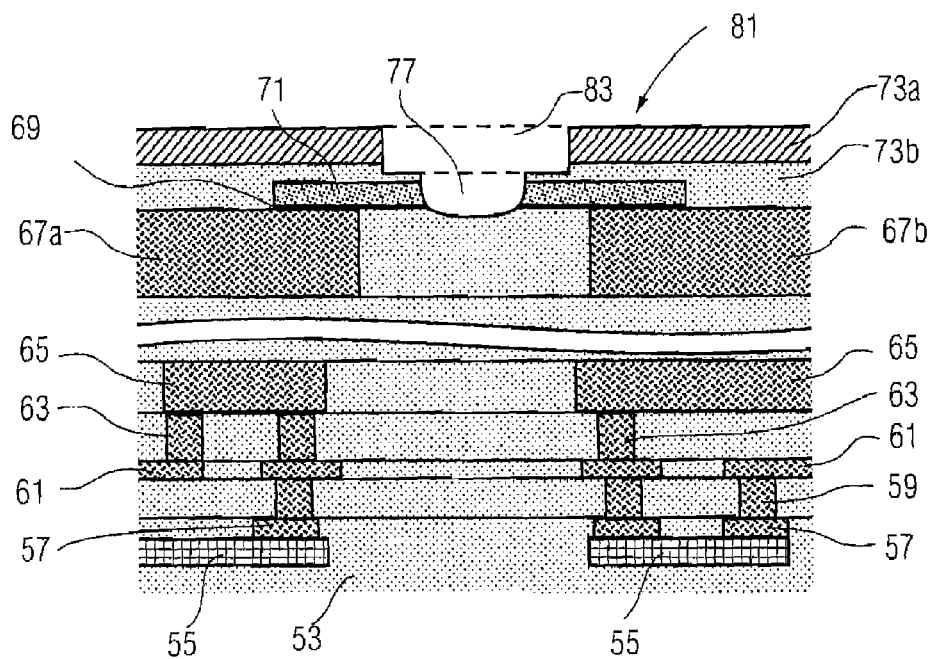

FIG. 4*b* shows a schematic cross-sectional view of the fuse structure 81 according to a third embodiment of the present invention after cutting the planar barrier multilayer assembly 69 and the fuse conductive trace 71. Because in the fuse structure 81 according to a third embodiment of the present invention shown in FIGS. 4*a*-4*b* the recess 83 extends to the fuse conductive trace 71, the reflection on the chip surface is increased, thereby necessitating a higher laser energy to cut the barrier multilayer assembly 69 and the fuse conductive trace 71. Also, a protection of the fuse conductive trace 71 against corrosion is decreased because the recess 83 extends to the fuse conductive trace 71 so that a fuse conductive trace not cut in the fuse structure 81 according to a third embodiment of the present invention can be attacked by corrosion and may sometimes even be influenced regarding its electric behavior.

Figure 5A:
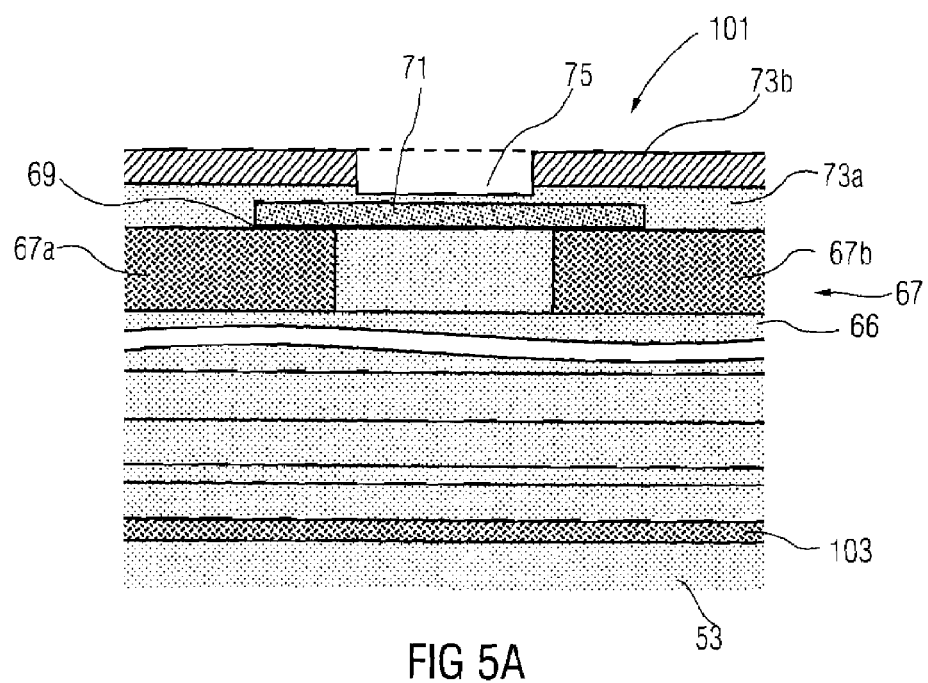
FIGS. 5a-5b are schematic cross-sectional views of a fuse structure according to a fourth embodiment of the present invention on a semiconductor device while cutting the fuse conductive trace.
Figure 5B:
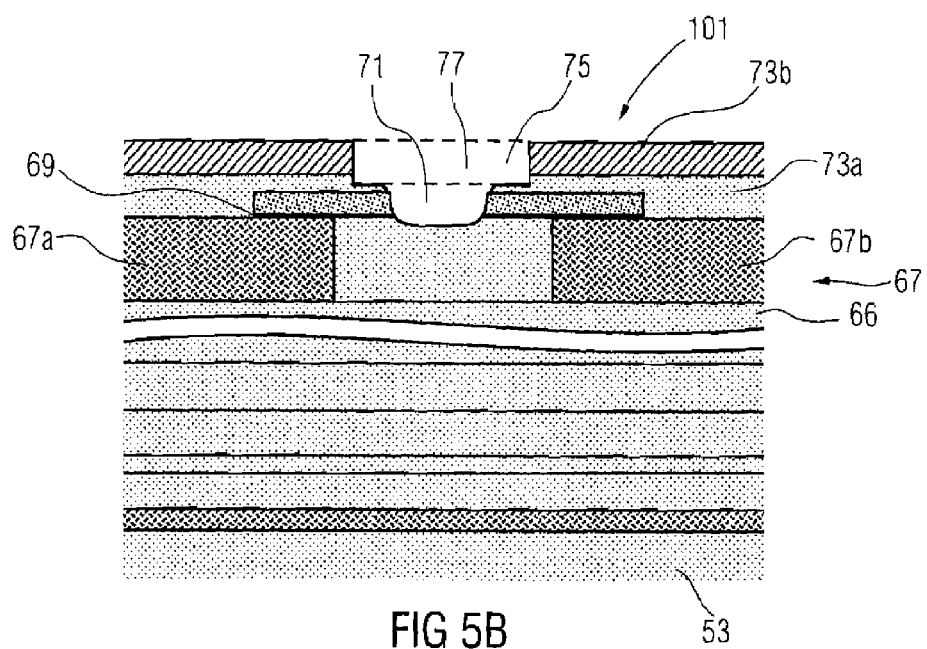

Schematic cross-sectional views of a fuse structure 101 according to a fourth embodiment of the present invention during cutting the fuse conductive trace 71 are shown in FIGS. 5*a*-5*b*. In what follows, in the description of the fuse structure 101 shown in FIG. 5*a* similar elements or elements appearing as similar relating to the fuse structure 51 according to a second embodiment of the present invention shown in FIG. 2*b* are provided with the same reference numerals. Further, a description of the design and the mode of operation of the fuse structure 101 shown in FIG. 5*a* is restricted to a description of the difference in the design and mode of operation as compared to the fuse structure 51 according to a second embodiment of the present invention shown in FIG. 2*b*.

In contrast to the fuse structure 51 according to a second embodiment of the present invention shown in FIG. 2*b*, in the fuse structure 101 according to a fourth embodiment of the present invention shown in FIG. 5*a*, a single conductive trace in the first metal level which in FIG. 2*b* is composed of structured conductive traces 57 isolated from one another is implemented as being continuous so that the continuous conductive trace forms a counter-electrode 103. Further, the metal levels are implemented so that no conductive traces are formed between the counter-electrode 103 on the one hand and the metallization layer and the planar barrier multilayer assembly 69 on the other hand.

FIG. 5*b* explains a schematic cross-sectional view of the fuse structure 101 according to a fourth embodiment of the present invention after cutting the fuse conductive trace 71.

The fuse structure 101 shown in FIGS. 5*a*-5*b* serves as a strip line for high-frequency applications and/or RF applications, wherein the high-frequency properties of the strip line implemented in this way are dependent on a distance of the counter-electrode 103 to the fuse conductive trace 71 and the fuse terminals and/or the metallization layer 67. Advantageously, the counter-electrode is disposed in the vicinity of the substrate 53 and away from the passivation 73*a*, 73*b* and/or away from the fuse conductive trace 71 so that the counter-electrode 103 is disposed in the semiconductor device shown here only partially so deep down that a probability of damaging when cutting the fuse conductive trace 71 with laser energy and in the corrosion processes starting after that is reduced. Also the counter-electrode 103, like the areas 67*a*, 67*b*, the barrier multilayer assembly 71 and the fuse conductive trace 71, for example, embodied as a planar structure and can therefore be created easily in the fuse structure 101.

Figure 6:
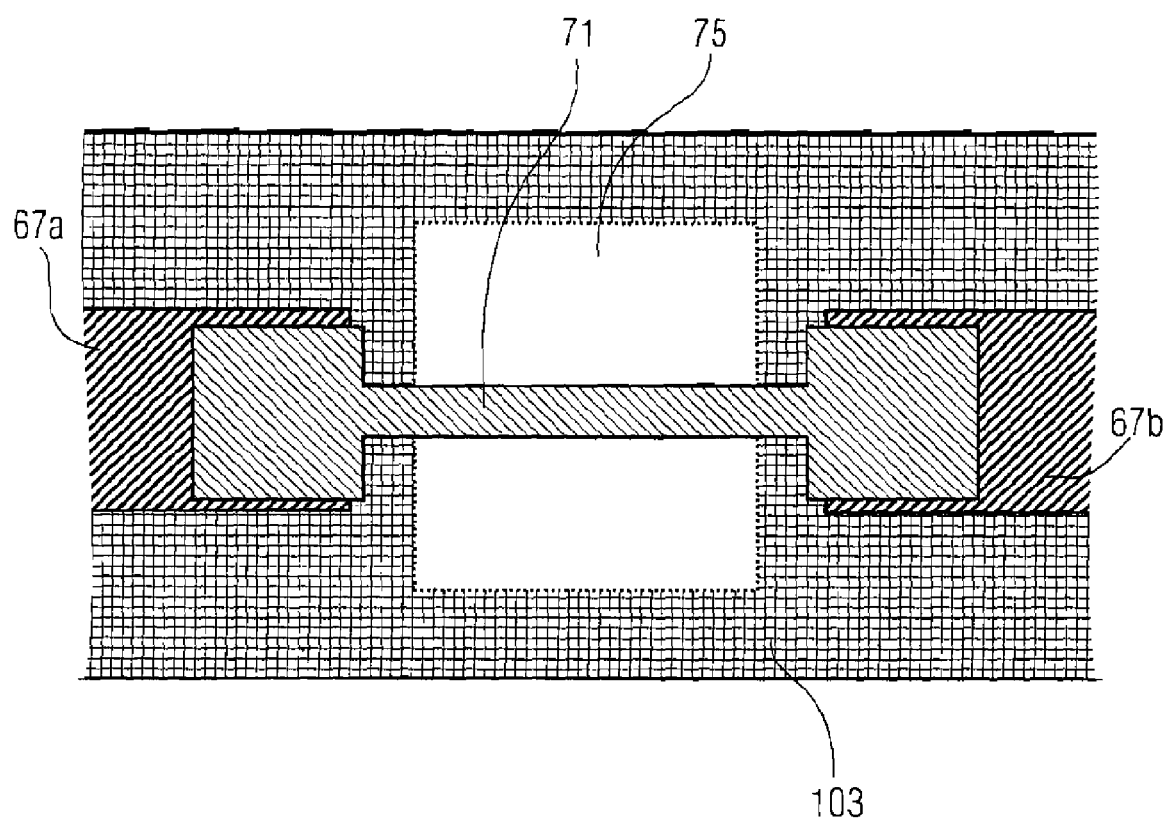
FIG. 6 is a top view of the fuse structure shown in FIG. 5b according to a fourth embodiment of the present invention.

FIG. 6 shows a top view of the fuse structure 101 according to a fourth embodiment of the present invention shown in FIG. 5*a*. The following top view of the fuse structure 101 is restricted to a description of the difference as compared to the top view of the fuse structure 51 shown in FIG. 3. In contrast to the top view of the fuse structure 51 according to the second embodiment of the present invention illustrated in FIG. 3, in the fuse structure 101 according to a fourth embodiment of the present invention, only the single fuse conductive trace 71 extends over the opening 75 in the passivation 73*a*, 73*b*. At the same time, in the top view of the fuse structure 101 the continuous counter-electrode 103 disposed under the fuse conductive trace 71 and the areas 67*a*, 67*b* can be seen.

Figure 7:
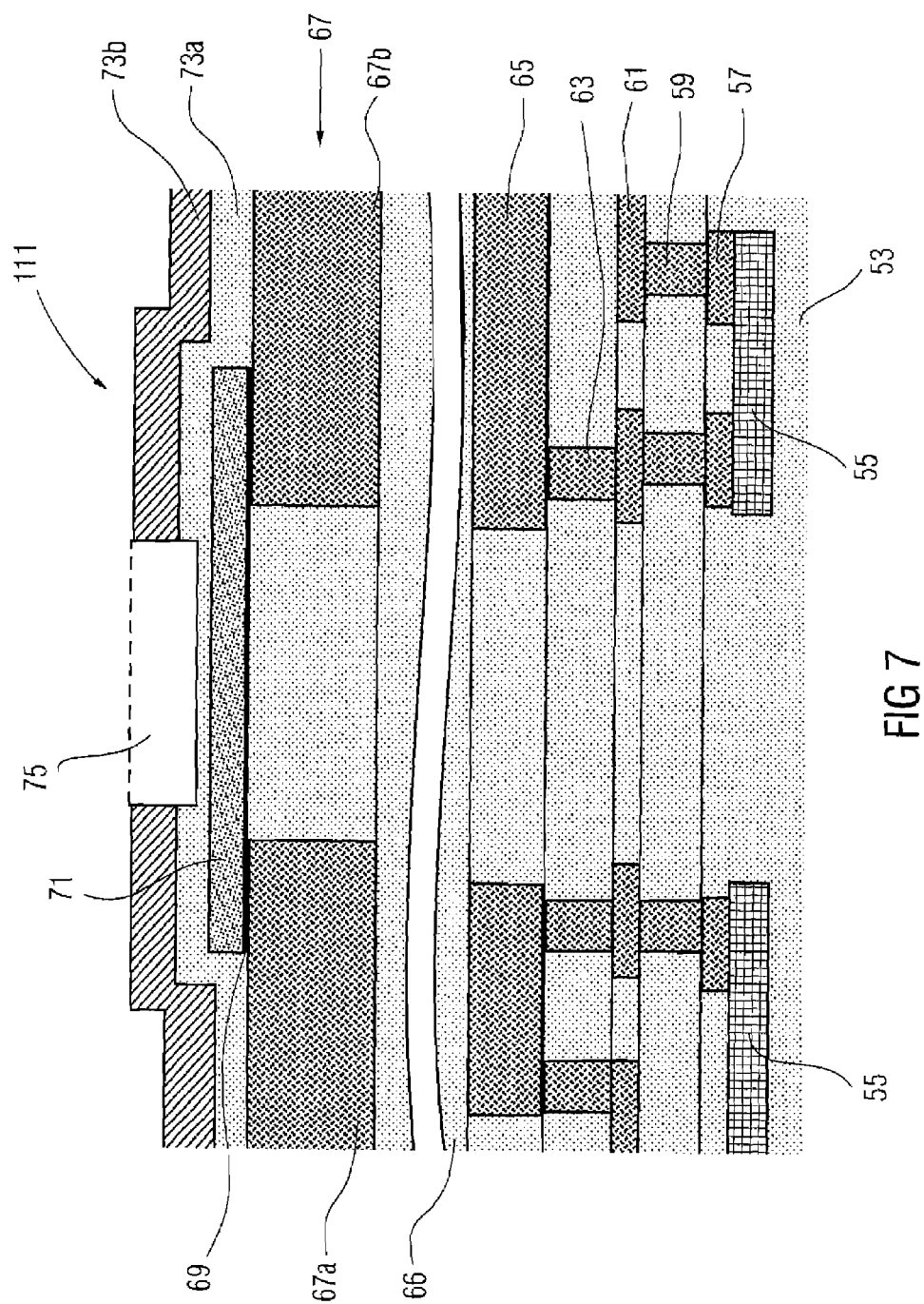
FIG. 7 is a schematic cross-sectional view of a fuse structure according to a fifth embodiment of the present invention on a semiconductor device.

FIG. 7 explains a schematic cross-sectional view of a fuse structure 111 according to a fifth embodiment of the present invention. In what follows, similar elements or elements appearing as similar relating to the fuse structure 51 according to a second embodiment of the present invention shown in FIG. 2*b* are provided with the same reference numerals. Further, a description of the design and the mode of operation of the fuse structure 111 according to a fifth embodiment of the present invention shown in FIG. 7 is restricted to a description of the differences in the design and the mode of operation as compared to the fuse structure 51 shown in FIG. 2*b*. In contrast to the fuse structure 51 shown in FIG. 2*b*, in the fuse structure 111 according to a fifth embodiment of the present invention the passivation 73*a*, 73*b* is not embodied in a planar manner. Thus, the areas of the passivation layers 73*a*, 73*b* covering the areas 67*a*, 67*b* of the metallization layer 67, and the areas of the passivation layers 73*a*, 73*b* covering the fuse conductive trace 71 mainly comprise the same layer thickness, so that the layer thicknesses of the two areas are similar within a tolerance of 10%.

Figure 8:
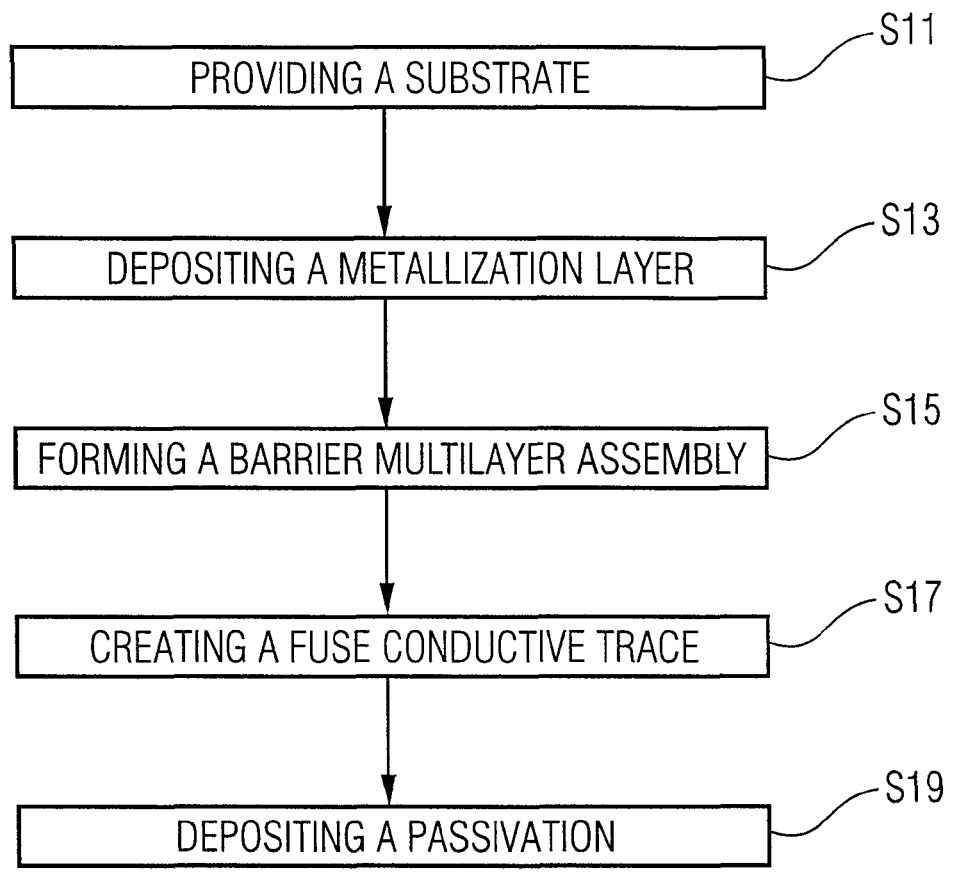
FIG. 8 shows the flow of a method of manufacturing a fuse structure according to an embodiment of the present invention.

A sequence of a method for manufacturing an electric device with a fuse structure according to an embodiment of the present invention is explained below relating to FIG. 8. In the method for manufacturing the fuse structure according to an embodiment of the present invention, a substrate is provided in step S11 on which subsequently, in step S13, a planar metallization layer is deposited such that the metallization layer comprises a first planar area of the metallization layer and a second planar area of the metallization layer which are separated by a recess and are thus electrically isolated from each other.

On the two areas of the metallization layer created, a planar barrier multilayer assembly which is composed of multiple barrier layers of different materials is formed in step S15. Then, in step S17, a fuse conductive trace is created on the planar barrier multilayer assembly which is arranged such that, if the fuse conductive trace were to be cut in a portion between the first area of the metallization layer and the second area of the metallization layer, the first area of the metallization layer would be isolated from the second part of the metallization layer.

Finally, in step S19, a passivation is deposited on the fuse conductive trace and the metallization layer. The passivation is, for example, structurally deposited such that a thickness of the passivation in an area above and/or in an area that, in a top view in a direction from a chip surface on which the passivation is deposited to a chip surface opposed to the mentioned chip surfaces, at least partially overlaps the fuse conductive trace, is smaller than a thickness of the passivation in an area which does not overlap the fuse conductive trace in the mentioned top view. Alternatively, the passivation could be deposited such that in the area above the fuse conductive trace an opening and/or recess forms extending to the fuse conductive trace so that the fuse conductive trace is not covered by the passivation and/or is exposed in the area of the opening.

In the fuse structures 13, 51, 81, 101, 111 the barrier multilayer assembly 17, 69 is composed in each case of three barrier layers 17a, 17b, 17c of different materials. However, the barrier multilayer assembly 17, 69 in a fuse structure according to a further embodiment of the present invention could comprise any number of barrier layers of different materials, as long as at least two barrier layers are present in the barrier multilayer assembly. In the fuse structures 13, 51, 81, 101, 111 according to an embodiment of the present invention, in a direction from the metallization layer 67 to the fuse conductive trace 71, for example, the planar barrier multilayer assembly comprises a barrier layer of tantalum nitride having a layer thickness in a range from 5 nm to 500 nm, a barrier layer of titanium having a layer thickness in a range from 2 nm to 200 nm, and a barrier layer of titanium nitride having a layer thickness in a range from 5 nm to 500 nm. However, in a fuse structure according to a further embodiment of the present invention, any dimensions and relations of the respective layer thicknesses of the barrier layers to one another are alternatives. Further, it is also conceivable in a fuse structure according to a further embodiment of the present invention to implement the fuse conductive trace 19, 71 and the areas 15a, 15b, 67a, 67b of the metallization layer so that these are not planar structures. Thus, the fuse conductive traces 19, 71 can be formed from any conductive materials, whereas the metallization layers 15, 67 can be formed from any metals or materials comprising at least partially a metal.

At the same time, in a fuse structure according to a further embodiment of the present invention, any circuit structure or any structure of conductive traces of metal and isolating areas can be disposed under the fuse structure 13, 51, 81, 101, 111 and/or in the substrate 11d, 53 or the metal level area 11c on a side facing away from the passivation or the first chip surface 11a. Thus, it would also be conceivable, for example, in a fuse structure according to a further embodiment of the present invention to form the conductive traces in the metal levels of copper or tungsten so that underneath the barrier multilayer assembly an arrangement of conductive traces results in four copper layers and/or copper levels and conductive traces in a tungsten layer and/or tungsten level. The conductive traces in the tungsten layer can then, for example, form the two areas 15a, 15b, 67a, 67b of the metallization layers 15, 67.

Also, in a fuse structure according to a further embodiment of the present invention, the passivation comprised of the oxide layer 73a and the nitride layer 73b can, for example, be formed from a single passivation layer or from any number of passivation layers. At the same time, in a fuse structure according to a further embodiment of the present invention, the fuse conductive trace 71 can be formed from any conductive material, such as aluminum or an aluminum alloy, such as an AlSiCu alloy. Further, in a fuse structure according to a further embodiment of the present invention, the passivation layer and/or the plurality of passivation layers can be formed from any materials which are dielectric, for example. It would be conceivable, in a fuse structure according to a further embodiment of the present invention, to deposit the passivation 73a, 73b with the opening 75 above the conductive trace 71 so that the passivation 73a, 73b in an area of the opening 75 comprises the oxide layer 73a with a thickness in a range from 20 nm to 2 µm, and the passivation in an area outside the opening 75 comprises the oxide layer 73a with a thickness in a range from 30 nm to 3 µa and, on the oxide layer 73a, the nitride layer 73b with a thickness of 55 nm to 5.5 µm. Alternatively, the respective layer thicknesses of the layers forming the passivation 73a, 73b in the fuse structure according to a further embodiment of the present invention could be formed arbitrarily.

Also, the substrate and/or the substrate area 53, 11d in the fuse structures 13, 51, 81, 101 according to the present invention could be formed from any material, such as a semiconductor material, for example, gallium arsenide, or any, even isolating material. Arbitrary application possibilities arise for the fuse structures 13, 51, 81, 101 according to an embodiment of the present invention, such as in high-frequency circuits having an electric behavior influenced by whether the fuse conductive trace 19, 71 is cut or not, wherein the high-frequency circuits are effectively connected electrically to the fuse conductive trace 19, 71 and provide an alternating signal having a frequency in a range above 1 MHz in a specified operational margin.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A fuse structure comprising:
a substrate;
a fuse conductive trace disposed closer to a first chip surface than to a second chip surface facing away from the first chip surface;
a metallization layer on the substrate disposed on a side of the fuse conductive trace facing away from the first chip surface; and
a planar barrier multilayer assembly disposed between the fuse conductive trace and the metallization layer and comprising multiple barrier layers of different materials, wherein the entire surface of the planar barrier multilayer assembly facing away from the first chip surface is a planar surface that lies in a single plane and wherein portions of the planar surface are in direct mechanical contact with first and second areas of the metallization layer;
wherein the fuse conductive trace, the metallization layer, and the barrier multilayer assembly are disposed such that when cutting the fuse conductive trace and the barrier multilayer assembly, a first area of the metallization layer is electrically isolated from a second area of the metallization layer.

2. The fuse structure according to claim 1, wherein the fuse conductive trace and the first and the second areas of the metallization layer are planar structures.

3. The fuse structure according to claim 1, wherein the multiple barrier layers are each planar structures.

4. The fuse structure according to claim 1, wherein the multiple barrier layers are each bordering one another.

5. The fuse structure according to claim 1, wherein the planar barrier multilayer assembly comprises a barrier layer and a further barrier layer completely overlapping in a top view in a direction from the first chip surface to the second chip surface.

6. The fuse structure according to claim 1, wherein the multiple barrier layers comprise tantalum, titanium, tantalum nitride or titanium nitride.

7. The fuse structure according to claim 1, wherein the barrier multilayer assembly comprises a first barrier layer of tantalum nitride, a second barrier layer of titanium and a third barrier layer of titanium nitride, wherein the second barrier layer is disposed between the first barrier layer and the third barrier layer.

8. The fuse structure according to claim 7, wherein a thickness of the first barrier layer is higher than a thickness of the second barrier layer and a thickness of the third barrier layer, and the thickness of the third barrier layer is higher than the thickness of the second barrier layer.

9. The fuse structure according to claim 1, wherein a thickness of the barrier multilayer assembly is in a range from 20 nm to 2 μm.

10. The fuse structure according to claim 1, further comprising a passivation disposed on the first chip surface and comprising a recess so that a thickness of the passivation in an area overlapping the fuse conductive trace in a top view of the fuse structure in a direction from the first chip surface to the second chip surface, is smaller than a thickness of the passivation in an area not overlapping the fuse conductive trace in the top view.

11. The fuse structure according to claim 1, further comprising a passivation disposed opposite the fuse conductive trace so that a distance of the fuse conductive trace from a surface of the passivation facing away from the fuse conductive trace is in a range of less than 500 nm.

12. The fuse structure according to claim 1, wherein the fuse conductive trace is implemented for being separated by bombardment with laser energy in a direction from the first chip surface to the second chip surface.

13. A method for manufacturing an electric device with a fuse structure, the method comprising:
depositing a first planar area and a second planar area of a metallization layer on a substrate so that the first planar area and the second planar area are separated from each other;
forming a planar barrier multilayer assembly comprising multiple barrier layers of different materials, on the planar areas of the metallization layer, wherein the entire surface of the planar barrier multilayer assembly facing the metallization layer is a planar surface that lies in a single plane and wherein portions of the planar surface are in direct mechanical contact with the first and second planar areas of the metallization layer; and
creating a fuse conductive trace on the barrier multilayer assembly so that cutting the fuse conductive trace and the barrier multilayer assembly would result in electrically isolating the first area of the metallization layer from the second area of the metallization layer.

14. The fuse structure according to claim 1, comprising a metal level area on the substrate including a plurality of metal layers, the fuse conductive trace, the metallization layer and the barrier multilayer assembly, wherein the metallization layer is disposed so close to the first chip surface that a ratio of a distance of the metallization layer from a border between the substrate and the metal level area to a distance of the metallization layer from the first chip surface is in a range of more than two.

15. The fuse structure according to claim 1, comprising a counter-electrode on a side of the metallization layer facing away from the first chip surface and electrically isolated from the metallization layer.

16. The fuse structure according to claim 15, wherein the counter-electrode is a planar structure.

17. The fuse structure according to claim 1, wherein the fuse conductive trace is electrically effectively connected to a high-frequency circuit and is adapted to influence an electric behavior of the high-frequency circuit so that the high-frequency circuit comprises a different electric behavior when the fuse conductive trace is cut as compared to when the fuse conductive trace were not cut, wherein the high-frequency circuit is adapted to provide a signal comprising a frequency in a range above 1 MHz.

18. The fuse structure according to claim 1, further comprising a passivation comprising a first passivation layer of an oxide and a second passivation layer of a nitride, wherein the first passivation layer is disposed between the second passivation layer and the fuse conductive trace.

19. The method according to claim 13, wherein creating the fuse conductive trace is followed by creating a structured passivation on the fuse conductive trace and the first and second planar areas of the metallization layer so that a thickness of the passivation in a first sub- area on the fuse conductive trace is lower than a thickness of the passivation in a second sub-area on one of the first and second planar areas of the metallization layer.

20. The method according to claim 13, wherein creating the fuse conductive trace is followed by depositing a passivation in a structured manner on one of the first and second planar areas of the metallization layer and the fuse conductive trace so that the fuse conductive trace is not covered by the passivation at least in one sub-area of the fuse conductive trace.

* * * * *